United States Patent [19]
Gay

[11] Patent Number: 5,900,776
[45] Date of Patent: May 4, 1999

[54] CURRENT SENSE CIRCUIT

[75] Inventor: Michael John Gay, Vaud, Switzerland

[73] Assignee: Motorola, Inc., Schaumburg, Ill.

[21] Appl. No.: 08/889,610

[22] Filed: Jul. 8, 1997

[30] Foreign Application Priority Data

Jul. 10, 1996 [GB] United Kingdom .................... 9614524

[51] Int. Cl.⁶ ............................ G05F 1/10; H03K 17/687
[52] U.S. Cl. ............................. 327/543; 327/51; 327/427
[58] Field of Search ................................... 327/538, 540, 327/541, 543, 108, 109, 427, 434, 50–51; 323/315

[56] References Cited

U.S. PATENT DOCUMENTS

| | | | |
|---|---|---|---|
| 4,010,425 | 3/1977 | Digwall et al. ............................ | 330/35 |
| 4,896,121 | 1/1990 | Larson ..................................... | 330/288 |
| 5,337,021 | 8/1994 | Zarabadi et al. ......................... | 330/288 |
| 5,394,079 | 2/1995 | Llewellyn ................................ | 323/315 |
| 5,525,927 | 6/1996 | Yung et al. .............................. | 327/543 |
| 5,543,745 | 8/1996 | Notani ..................................... | 327/543 |
| 5,617,056 | 4/1997 | Main et al. .............................. | 323/315 |

Primary Examiner—Toan Tran
Attorney, Agent, or Firm—Sharon K. Coleman

[57] ABSTRACT

A current sense circuit (100) for providing an output signal (Iout) representative of a current signal (Id) flowing through a FET output device (101) comprises a first transistor (102) for providing an image current signal ($I_m$) which is substantially proportional to the current signal flowing through the FET output device (101) until the drain-source voltage signal of the FET output device (101) is less than a predetermined voltage and a second transistor (104) coupled to a control electrode of the first transistor (102) and for coupling to the gate electrode of the FET output device (101). The first (102) and second (104) transistors are matched and have the same threshold voltages as that of the FET output device (101). The second transistor (104) provides a correction current signal ($I_c$) when the drain-source voltage signal of the FET output device (101) is less than the predetermined voltage. Subtracting circuitry (106) coupled to the first (102) and second (104) transistors subtracts the correction current signal ($I_c$) from the image current signal ($I_m$) to provide a corrected image current signal which is substantially proportional to the current signal flowing through the FET output device (101). The output signal (Iout) comprises the image current signal ($I_m$) or corrected image current signal depending on the drain-source voltage of the FET output device (101).

6 Claims, 4 Drawing Sheets

CURRENT SENSE CIRCUIT

FIELD OF THE INVENTION

This invention relates to a current sense circuit for providing an output signal representative of a current signal through a FET output device.

BACKGROUND OF THE INVENTION

Circuits providing high current outputs commonly require circuitry to limit the maximum level which may be drawn. Such circuitry comprises, conceptually, a negative feedback loop which regulates the drive to the circuit's output stage in response to a signal which is proportional to the amount by which some image of the output current exceeds a reference. In the past it has been difficult to provide an image signal which is an accurate image of the output current in circuits employing Field Effect Transistor (FET) output stages.

One known technique uses the voltage developed across a resistor in the output current path as the image signal. However, such a technique has an irremediable disadvantage in that the voltage drop across the resistor subtracts from the output voltage range of the circuit.

Other known circuitry avoid this problem by using a small sense transistor having control electrodes connected in parallel with those of the large output device of the output stage to provide the image signal. This can work well with bipolar transistor output devices. However, with high current FET or MOS output devices, in typical applications the gate-source voltage required for the output device to pass a given current varies substantially as a function of the drain-source voltage. This means that the current in the small sense transistor, which transistor receives the same gate-source voltage but does not have the same drain-source voltage, then no longer accurately represents the output current.

Circuitry for forcing the drain-source voltage of the sense transistor to match that of the output device over a relevant part of the output voltage range can be envisaged but such circuitry is complex and expensive.

It would therefore be desirable to provide an improved current sense circuit for providing an output signal representative of a current signal through a FET output device for which the above problems and disadvantages are mitigated.

SUMMARY OF THE INVENTION

In accordance with the present invention there is provided a current sense circuit for providing an output signal representative of a current signal flowing through a FET output device having gate, source and drain electrodes, the current sense circuit comprising:

a first transistor for providing an image current signal which is substantially proportional to the current signal flowing through the FET output device until a voltage signal developed between the drain and source electrodes of the FET output device is less than a predetermined voltage;

a second transistor coupled to a control electrode of the first transistor and for coupling to the gate electrode of the FET output device, first and second transistors being matched and having the same threshold voltages as the threshold voltage of the FET output device, the second transistor being enabled when the voltage signal developed between the drain and source electrodes of the FET output device is less than the predetermined voltage so as to provide a correction current signal; and subtracting circuitry coupled to the first and second transistors for subtracting the correction current signal from the image current signal to provide a corrected image current signal which is substantially proportional to the current signal flowing through the FET output device, wherein the output signal comprises the image current signal or corrected image current signal depending on the voltage signal developed across the drain and source electrodes of the FET output device.

Preferably, the predetermined voltage is equal to the difference between the gate-source voltage and threshold voltage of the FET output device.

In a preferred arrangement, the subtracting circuitry comprises a current mirror.

The present invention therefore provides a circuit which generates a signal which accurately represents the current signal flowing in a FET output device irrespective of the drain-source voltage of the device using only simple inexpensive components.

BRIEF DESCRIPTION OF THE DRAWINGS

A current sense circuit in accordance with the present invention will now be described, by way of example, with reference to the accompanying drawings in which.

DETAILED DESCRIPTION OF THE DRAWINGS

Figure 1:
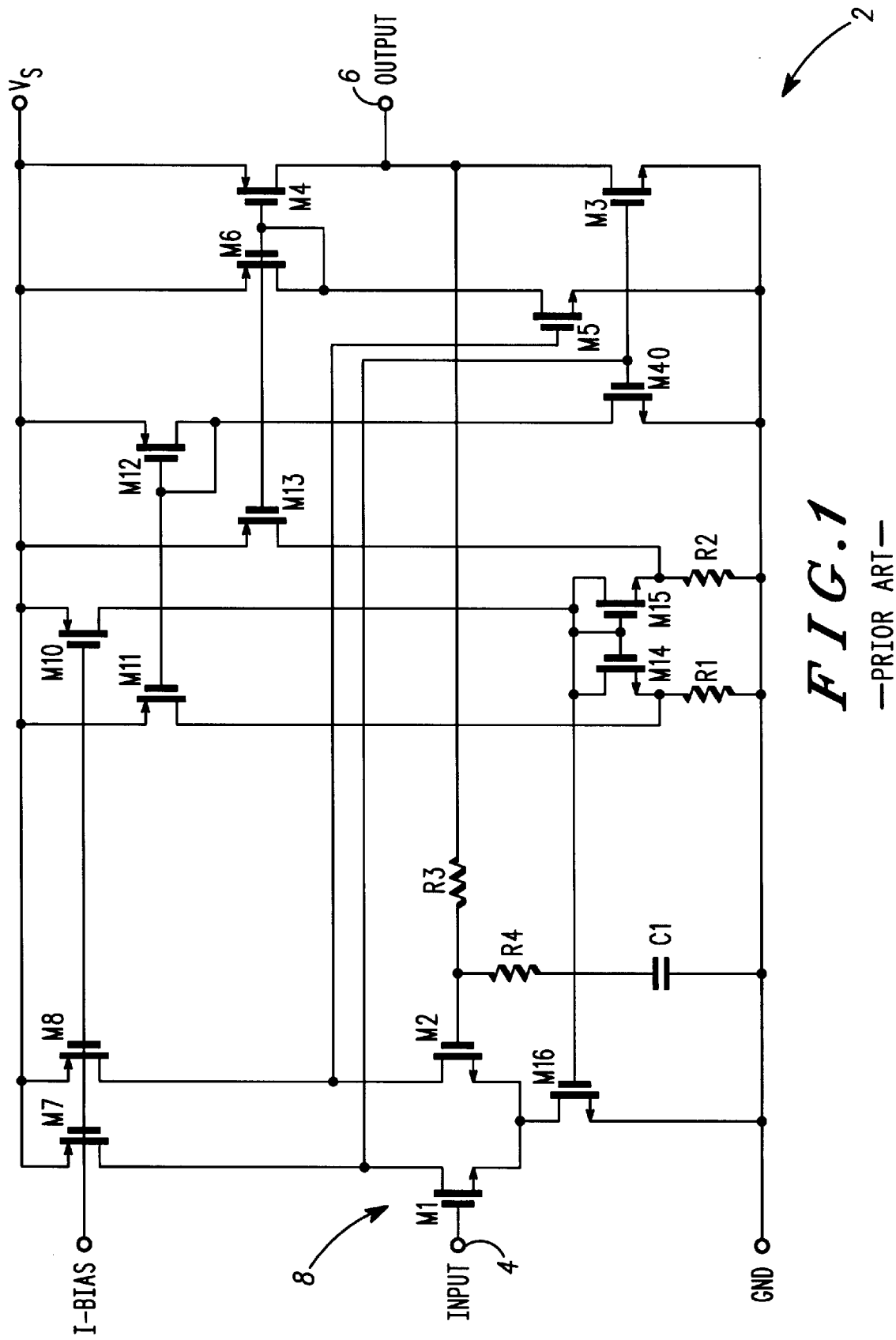
FIG. 1 is a schematic circuit diagram of a known push-pull amplifier.

Referring firstly to FIG. 1, a known push-pull amplifier 2, in simplified, form receives an input signal at an input 4 and provides an output signal at an output 6. The amplifier 2 comprises complementary MOS output transistors M3 and M4. Output transistor M3 is an NMOS device and output transistor M4 is a PMOS device. The output transistor M4 is driven by transistors M5 and M6 and the output 6 is connected to the common connected drain electrodes of output transistors M3 and M4. The amplifier 2 further comprises an input stage 8 comprising a phase splitter pair of transistors M1, M2, with current sources M7, M8, bias control circuitry M10–M16, M40 and resistors R1, R2, for controlling the quiescent current, and a series voltage feedback network R3, R4 and C1. Such an amplifier 2 provides the maximum output voltage excursion. The operation of such a push-pull amplifier 2 is well known in the art.

Figure 2:
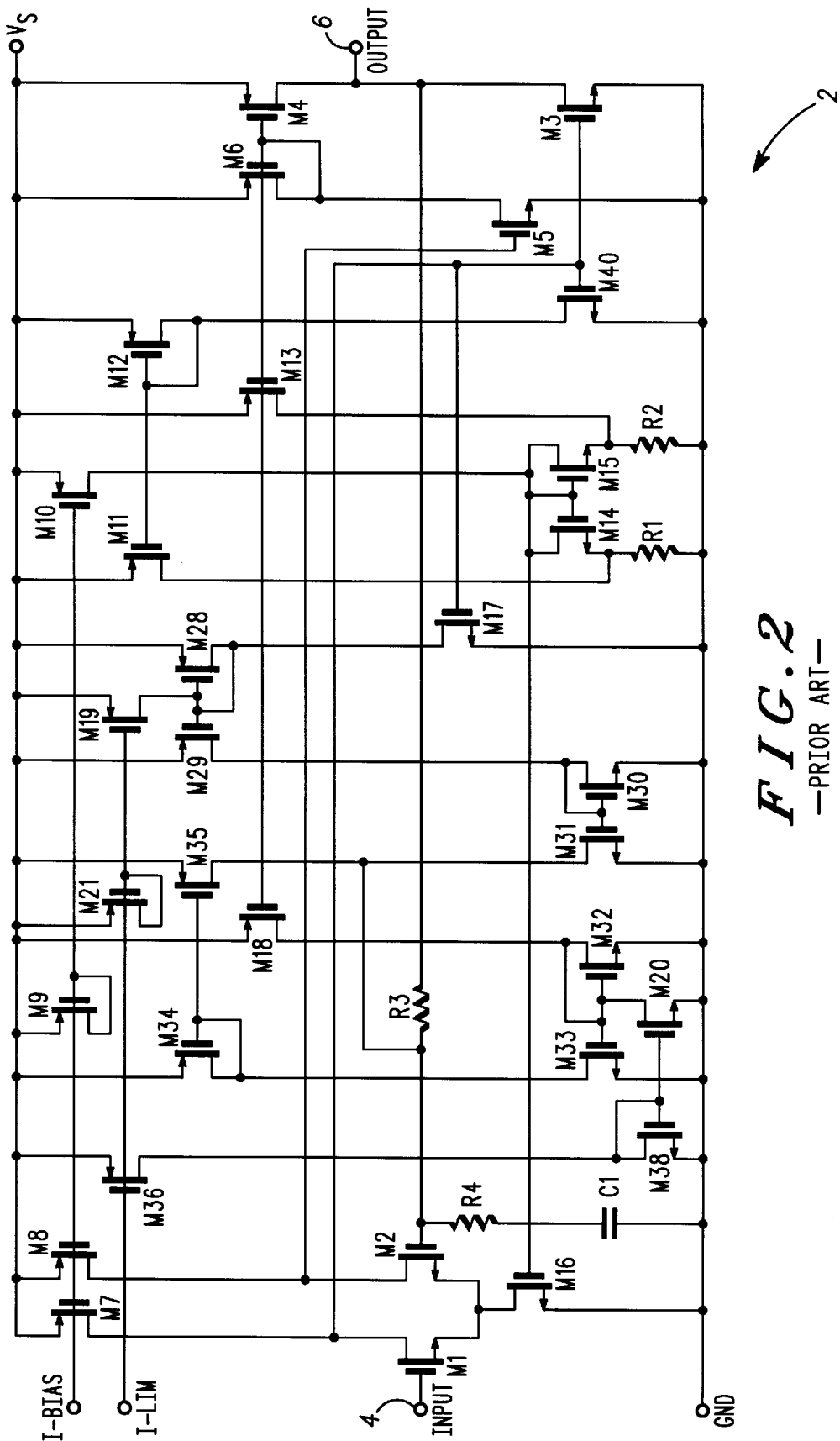
FIG. 2 is a schematic circuit diagram of the known push-pull amplifier of FIG. 1 with a current limiter.

For applications which require that the output current drawn from the output 6 be limited to a maximum value, the amplifier 2 requires a current limiter. An example of the amplifier 2 with a simple current limiter is shown in FIG. 2. Like components to those of FIG. 1 are referenced by the same reference figure.

Image transistors M17 and M18 provide image signals of the current signals in output transistors M3 and M4 respectively. Transistors M19 and M20 provide first and second reference current signals respectively in response to the current I-Lim drawn by transistor M21, which first and second reference current signals are subtracted from the image signals provided by image transistors M17 and M18 respectively. The difference between the first reference current signal and the image signal provided by image transistor M17 is mirrored by transistors M28, M29, M30 and M31 and fed back to the gate electrode of phase splitter transistor M2. The difference between the second reference current signal and the image signal provided by image transistor M18 is mirrored by transistors M32, M33, M34 and M35 and fed back to the gate electrode of phase splitter transistor M2. Thus, the negative feedback would be increased to limit the output current signal at the output 6, once the output current signal exceeds values determined by the first and second reference current signals and the ratio of the transconductances of output transistor M3 and image transistor M17 and the associated current mirrors or output transistor M4 and image transistor M18 and the associated current mirrors, respectively.

As explained in the introduction, a problem with this push-pull amplifier and current limiter arrangement shown in FIG. 2 is that the gate-source voltages of output transistors M3 and M4 increase as their drain-source voltages become small. As the drain-source voltages of transistors M3 and M4 become small, in fact when $V_{DS} < (V_{GS} - V_T)$, where $V_{DS}$ is the drain-source voltage, $V_{GS}$ is the gate-source voltage and $V_T$ is the transistor threshold voltage, the image currents provided by image transistors M17 and M18 do not track the output signal at the output 6, becoming larger than the values determined by the ratio of the transconductances when all the transistors are operating in the saturated mode. This means that the current limiter may limit the output current signal at too low a level should the load be such that the output voltage excursion approach the maximum of which the circuit is capable.

There is therefore a need for a circuit which provides a signal which accurately represents the current signal flowing in a FET output device irrespective of the drain-source voltage of the device.

Figure 3:
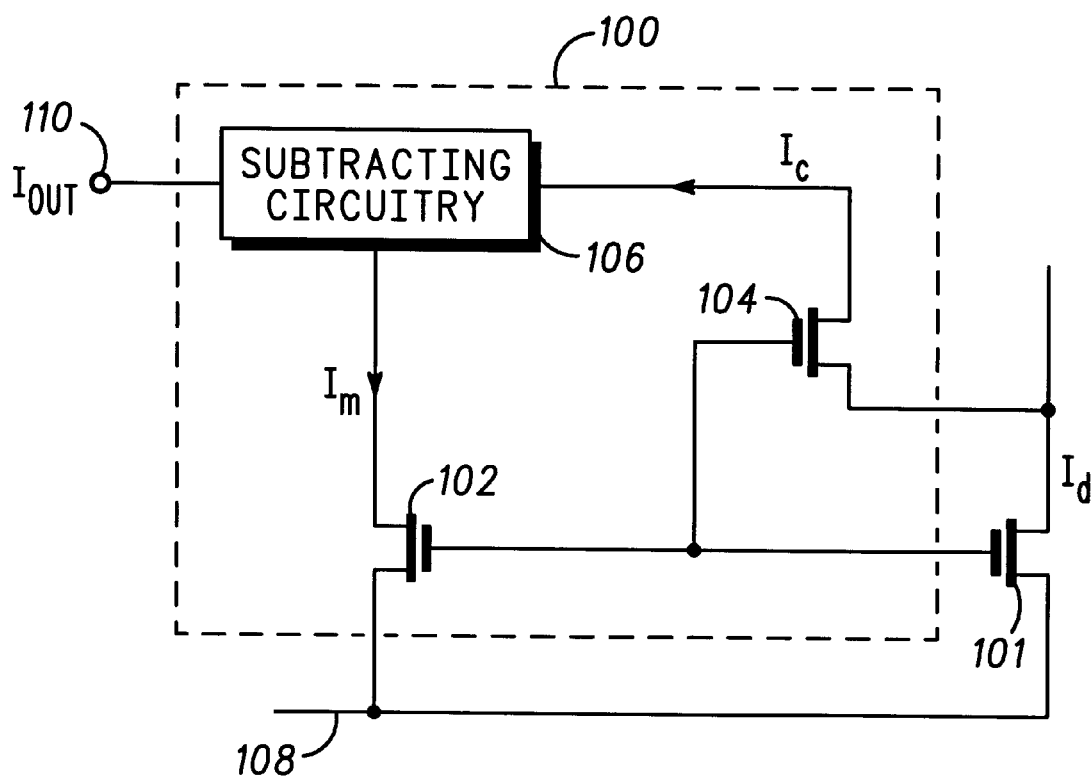
FIG. 3 is a schematic circuit diagram of a current sense circuit in accordance with the present invention.

Referring now to FIG. 3, a current sense circuit 100 in accordance with a preferred embodiment of the invention provides an output signal $I_{out}$ at an output 110 representative of a current signal $I_d$ through a FET output device 101 irrespective of variations in the drain-source voltage $V_{DS}$ of the FET output device 101. The current sense circuit 100 comprises a first transistor 102 and a second transistor 104 and subtracting circuitry 106 having an output coupled to the output 110 of the current sense circuit 100.

The first transistor 102 has a control electrode coupled to the gate electrode of the FET output device 101, a first current electrode coupled to the subtracting circuitry 106 and a second current electrode coupled to a reference voltage supply line 108. The second transistor 104 has a control electrode coupled to the gate electrode of FET output device 101 and the control electrode of the first transistor 102, a first current electrode coupled to the subtracting circuitry 106 and a second current electrode coupled to the drain electrode of the FET output device 101. The source electrode of the FET output device 101 is also coupled to the reference voltage supply line 108. The first 102 and second 104 transistors are matched and have the same threshold voltage as the threshold voltage $V_T$ of the FET output device 101.

It will be appreciated that the FET output device 101 and current sense circuit 100 in use will be part of an output stage whose output is taken from the drain electrode of the FET output device 101.

The first transistor 102 provides an image current signal $I_m$ to the subtracting circuitry 106. The image current signal $I_m$ is substantially equal to the current signal flowing through the FET output device 101 until the voltage signal $V_{DS}$ developed across the drain and source electrodes of the FET output device 101 is less than a predetermined voltage level. The drain-source voltage signal $V_{DS}$ reaches the predetermined voltage level when the following condition is satisfied:

$$V_{DS} = (V_{GS} - V_T)$$

where $V_{DS}$ is the drain-source voltage of FET output device 101

$V_{GS}$ is the gate-source voltage of FET output device 101

$V_T$ is the transistor threshold voltage of FET output device 101

When the drain-source voltage $V_{DS}$ is less than the predetermined voltage level, the FET output device 101 is operating in its triode or non-saturated region whereby the current signal Id in the FET output device 101 at a given $V_{GS}$ tends to be less than it would were the device operation in the saturated region following the equation:

$$I_d = \beta_{101}(V_{GS(101)} - V_{T(101)} - 0.5 V_{DS(101)})V_{DS(101)} \tag{1}$$

where $\beta_{101}$ is a scale factor depending on the characteristics of FET output device 101

When the FET output device 101 is operating in its triode region, the image current signal $I_m$ flowing through the first transistor 102 increases so that it no longer matches the current signal $I_d$ flowing through the FET output device 101. However, with the current sense circuit 100 in accordance with the present invention, as soon as the drain-source voltage $V_{DS}$ is less than the predetermined voltage level, the voltage signal on the control electrode of the second transistor 104 becomes equal to the threshold voltage $V_T$ of the FET output device 101, which enables the second transistor 104 so that it is turned on and a correction current signal $I_c$ flows therethrough. As the drain-source voltage $V_{DS}$ decreases the second transistor 104 is turned on harder which increases the correction current signal $I_c$.

When the correction current signal $I_c$ is generated, it is supplied to the subtracting circuitry 106 which subtracts the correction current signal $I_c$ from the image current signal $I_m$ and provides a corrected image current signal $(I_m - I_c)$ which is substantially proportional to the current signal flowing through the FET output device 101. The subtracting circuitry 106 supplies the image current signal $I_m$ to the output 110 unless the correction current signal $I_c$ is generated in which case the subtracting circuitry 106 supplies the corrected image current signal $(I_m - I_c)$ to the output 110. In other words depending on the voltage level of the drain-source voltage signal $V_{DS}$, the subtracting circuitry 106 provides at the output 110 the image current signal $I_m$ or corrected image current signal $(I_m - I_c)$.

It will therefore be appreciated that as the drain-source voltage $V_{DS}$ of the FET output device 101 becomes smaller, the image current signal $I_m$ provided by the first transistor 102 does not bear the correct relationship to the output current signal $I_d$ flowing through the FET output device 101. However, the error in the image current signal $I_m$ can be compensated for by subtracting the correction current signal $I_c$ provided by the second transistor 104 from the image current signal $I_m$. From the following analysis, it can be shown that the compensation provided by the correction current signal $I_c$ is exact.

Assuming that the first 102 and second 104 transistors are MOS FETs, and using the usual approximations to the MOS characteristic equations, the image current signal $I_m$ in the first transistor 102 is given by:

$$I_m = (\beta_{102}/2)(V_{GS(102)} - V_{T(102)})^2 \quad (2)$$

where $V_{GS(102)}$ is the gate-source voltage of the first transistor 102

$V_{T(102)}$ is the threshold voltage of the first transistor 102

Moreover, the correction current signal $I_c$ in the matched second transistor 104 is given by:

$$I_c = (\beta_{104}/2)(V_{GS(102)} - V_{T(104)} - V_{DS(101)})^2 \quad (3)$$

Using the fact that the first 102 and second 104 transistors are matched and that their threshold voltages furthermore match the threshold voltage $V_T$ of the FET output device 101 and noting that $V_{GS(102)} = V_{GS(101)}$, from equations (2) and (3) we find that:

$$I_m - I_c = \beta_{102} V_{DS(101)} [(V_{GS(101)} - V_{T(101)} - 0.5 V_{DS(101)})] \quad (4)$$

By comparing equation (4) with equation (1), it is clear the corrected image current signal ($I_m - I_c$) is the correctly scaled value of the triode region operating current in the FET output device 101.

Preferably, the means for subtracting comprises a current mirror.

Figure 4:
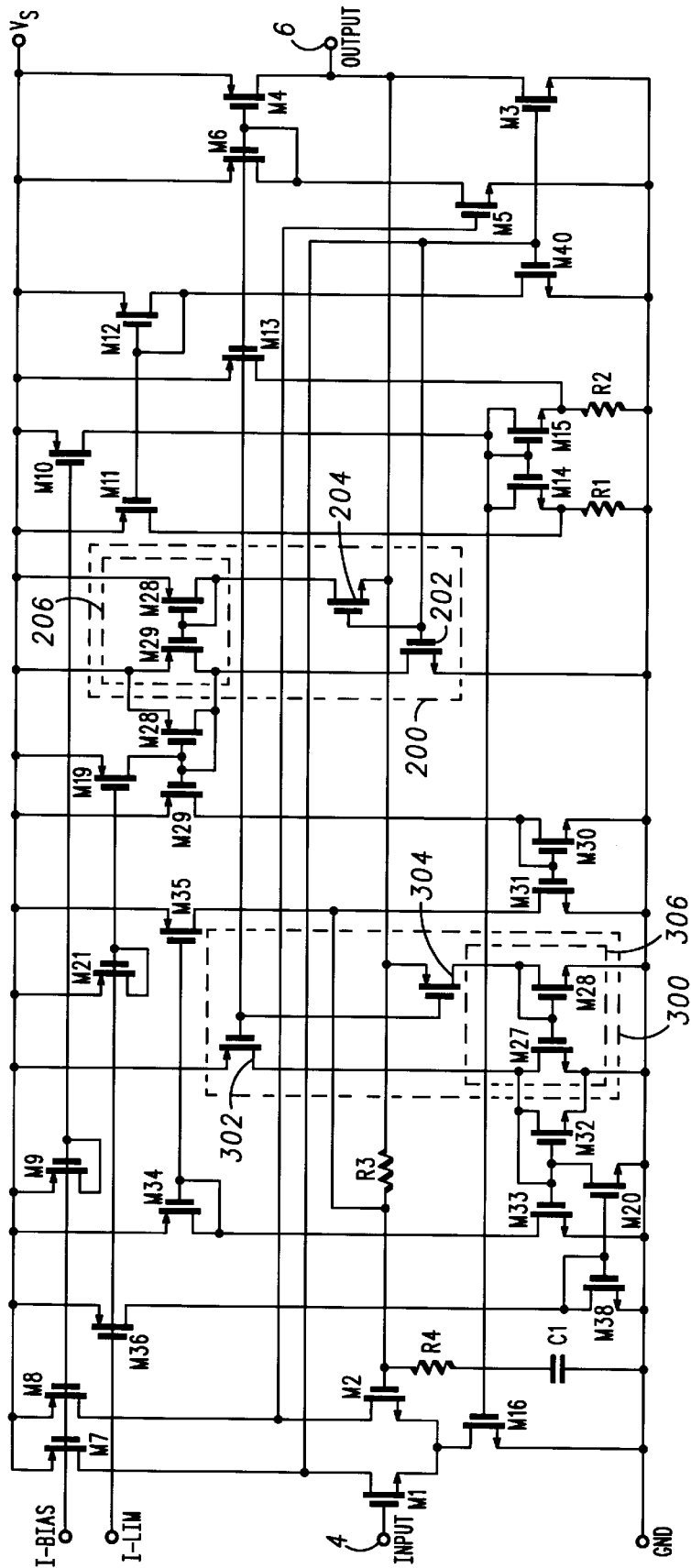
FIG. 4 is a schematic circuit diagram of a push-pull amplifier with a current limiter and current sense circuits in accordance with the present invention.

Referring now also to FIG. 4, first 200 and second 300 current sense circuits in accordance with the present invention are shown implemented in the push-pull amplifier 2 of FIG. 2 for output transistors M3 and M4 respectively. Like components to those of FIGS. 2 are referred to by the same reference figure. Like components to those of FIG. 3 are referred to by the same reference numeral plus 100 for the first current sense circuit 200 and plus 200 for the second current sense circuit 300.

The first transistor 202 of the first current sense circuit 200 is an NMOS transistor having a gate electrode coupled to the gate electrode of the output transistor M3, a drain electrode coupled to subtracting circuitry 206 and a source electrode coupled to a reference voltage supply line, which is preferably ground GND. The subtracting circuitry 206 in the preferred embodiment comprises a current mirror formed by transistors M24 and M25. The second transistor 204 is a NMOS transistor having a gate electrode coupled to the gate electrode of output transistor M3 and the gate electrode of the first transistor 202, a drain electrode coupled to the subtracting circuitry 206 and a source electrode coupled to the drain electrode of the output transistor M3. The first 202 and second 204 transistors are matched and have the same threshold voltage $V_T$ as the threshold voltage $V_T$ of the output transistor M3.

The first transistor 302 of the second current sense circuit 300 is an PMOS transistor having a gate electrode coupled to the gate electrode of the output transistor M4, a drain electrode coupled to subtracting circuitry 306 and a source electrode coupled to a second reference voltage supply line Vs. The subtracting circuitry 306 in the preferred embodiment comprises a current mirror formed by transistors M26 and M27. The second transistor 304 is a PMOS transistor having a gate electrode coupled to the gate electrode of output transistor M4 and the gate electrode of the first transistor 302, a drain electrode coupled to the subtracting circuitry 306 and a source electrode coupled to the drain electrode of the output transistor M4. The first 302 and second 304 transistors are matched and have the same threshold voltage $V_T$ as the threshold voltage $V_T$ of the output transistor M4.

When the drain-source voltages of the output transistors M3, M4 are high, the second transistors 204 and 304 do not conduct and the first transistors 202 and 302 alone provide accurate image signals of the current signals in the output transistors M3 and M4. When the drain-source voltages of the output transistors M3 and M4 fall below their gate-source voltages less their threshold voltages then the output transistor's M3 and M4 current signals tend to fall according to equation (1) above. The overall feedback via the network R3, R4, C1 will cause the gate-source voltages of the output transistors M3 and M4, and hence the first transistors 202 and 302, to increase to compensate the loss of output current. The increased gate-source voltages of the first transistors 202, 302 will increase the image current signals in the first transistors 202 and 302 which image current signals will then no longer bear the correct relationships to those in the output transistors M3 and M4. Under these conditions, however, the second transistors 204 and 304 will also be enabled and enter conduction so that correction current signals flow therethrough. The correction current signals provided by the second transistors 204, 304 are subtracted from the respective image current signals supplied by the first transistors 202 and 204 by subtracting circuitry 206 and 306 respectively so as to compensate for the error.

It will be appreciated that the current sense circuit in accordance with the present invention can be implemented in other types of output stages having a FET output device and which require the current signal in the FET output device to be limited to a maximum value.

In summary the present invention provides a current sense circuit which provides an accurate image of the current in a FET output device irrespective of the drain-source voltage of the FET output device without the need for complex circuitry.

I claim:

1. A current sense circuit for providing an output signal representative of a current signal flowing through a FET output device having gate, source and drain electrodes, the current sense circuit comprising:

a first transistor for providing an image current signal which is substantially proportional to the current signal flowing through the FET output device until a voltage signal developed between the drain and source electrodes of the FET output device is less than a predetermined voltage;

a second transistor having a control electrode coupled to a control electrode of the first transistor and for coupling to the gate electrode of the FET output device, first and second transistors being matched and having the same threshold voltages as the threshold voltage of the FET output device, the second transistor being enabled when the voltage signal developed between the drain and source electrodes of the FET output device is less than the predetermined voltage so as to provide a correction current signal; and subtracting circuitry coupled to the first and second transistors for subtracting the correction current signal from the image current signal to provide a corrected image current signal which is substantially proportional to the current signal flowing through the FET output device, wherein the output signal comprises the image current signal or corrected image current signal depending on the voltage signal developed across the drain and source electrodes of the FET output device.

2. A current sense circuit according to claim 1 wherein the predetermined voltage is equal to the difference between the gate-source voltage and threshold voltage of the FET output device.

3. A current sense circuit according to claim 1 wherein the subtracting circuitry comprises a current mirror.

4. A current sense circuit according to claim 1 wherein the first transistor has a first current electrode coupled to the subtracting circuitry, a second current electrode coupled to a reference voltage supply line and a control electrode for coupling to the gate electrode of the FET output device.

5. A current sense circuit according to claim 1 wherein the second transistor has a first current electrode coupled to the subtracting circuitry and a second current electrode for coupling to the drain electrode of the FET output device.

6. A current sense circuit for providing an output signal representative of a current signal flowing through a FET output device having gate, source and drain electrodes, the current sense circuit comprising:

- a first transistor having a first current electrode, a second current electrode coupled to a reference voltage supply line and a control electrode for coupling to the gate electrode of the FET output device, the first transistor for providing an image current signal which is substantially proportional to the current signal flowing through the FET output device until a voltage signal developed between the drain and source electrodes of the FET output device is less than a predetermined voltage;

- a second transistor having a first current electrode, a second current electrode for coupling to the drain electrode of the FET output device and a control electrode coupled to the control electrode of the first transistor, the first and second transistors being matched and having the same threshold voltages as the threshold voltage of the FET output device, the second transistor being enabled when the voltage signal developed between the drain and source electrodes of the FET output device is less than the predetermined voltage so as to provide a correction current signal; and subtracting circuitry coupled to the first current electrodes of the first and second transistors for subtracting the correction current signal from the image current signal to provide a corrected image current signal which is substantially proportional to the current signal flowing through the FET output device, wherein the output signal comprises the image current signal or corrected image current signal depending on the voltage signal developed across the drain and source electrodes of the FET output device, wherein the subtracting circuitry comprises a current mirror including:

- a first diode-coupled transistor having a first current electrode coupled to the first current electrode of the second transistor, a second current electrode coupled to a second reference voltage supply line and a control electrode; and

- a second transistor having a first current electrode coupled to the first current electrode of the first transistor, a second current electrode coupled to the second reference voltage supply line and a control electrode coupled to the control electrode of the first diode-coupled transistor.

* * * * *